United States Patent
Ichinose et al.

(10) Patent No.: US 9,306,100 B2
(45) Date of Patent: Apr. 5, 2016

(54) SOLAR CELL MODULE

(71) Applicant: SANYO ELECTRIC CO., LTD., Moriguchi, Osaka (JP)

(72) Inventors: Hitomi Ichinose, Izumiotsu (JP); Tasuku Ishiguro, Izumiotsu (JP); Naoto Imada, Osaka (JP); Toshiyuki Sakuma, Izumisano (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/225,472

(22) Filed: Mar. 26, 2014

(65) Prior Publication Data
US 2014/0202534 A1 Jul. 24, 2014

Related U.S. Application Data

(63) Continuation of application No. PCT/JP2012/078834, filed on Nov. 7, 2012.

(30) Foreign Application Priority Data

Nov. 10, 2011 (JP) .................................. 2011-246067
Dec. 22, 2011 (JP) .................................. 2011-281438
Dec. 22, 2011 (JP) .................................. 2011-281565

(51) Int. Cl.
*H01L 31/044* (2014.01)
*H01L 31/048* (2014.01)
(Continued)

(52) U.S. Cl.
CPC ............... *H01L 31/048* (2013.01); *B32B 3/02* (2013.01); *B32B 3/08* (2013.01); *B32B 7/12* (2013.01); *B32B 9/005* (2013.01); *B32B 15/08* (2013.01); *B32B 15/20* (2013.01);
(Continued)

(58) Field of Classification Search
CPC ........ H01L 31/00–31/078; Y02E 10/50–10/60
USPC ..................................................... 136/243–265
See application file for complete search history.

(56) References Cited

U.S. PATENT DOCUMENTS 6,204,443 B1 * 3/2001 Kiso ................. B32B 17/10788
126/621
2005/0051204 A1 * 3/2005 Oi et al. ........................ 136/251
(Continued)

FOREIGN PATENT DOCUMENTS

EP 2277693 A1 1/2011
JP H10-341030 A 12/1998
(Continued)

*Primary Examiner* — Bach Dinh
(74) *Attorney, Agent, or Firm* — Marvin A. Motsenbocker; Mots Law, PLLC (57) ABSTRACT

Provided is a solar cell module wherein solar cells and a sealing material, which is sealing the solar cells, are not easily peeled from each other. A solar cell module is provided with solar cells, a wiring material, and a sealing material. Each of the solar cells has first and second main surfaces. The wiring material is electrically connected to each of the solar cells on the first main surface. The sealing material seals the solar cells. The sealing material has a first sealing section and a second sealing section. The first sealing section contains a non-bridging resin. The first sealing section is positioned on the first main surface side of the solar cells. The second sealing section contains a bridging resin and pigment. The second sealing section is positioned on the second main surface side of the solar cells.

9 Claims, 5 Drawing Sheets

(51) Int. Cl.
| | |
|---|---|
| *H01L 31/02* | (2006.01) |
| *B32B 17/10* | (2006.01) |
| *B32B 27/32* | (2006.01) |
| *H01L 31/056* | (2014.01) |
| *H01L 31/049* | (2014.01) |
| *B32B 7/12* | (2006.01) |
| *B32B 9/00* | (2006.01) |
| *B32B 15/08* | (2006.01) |
| *B32B 15/20* | (2006.01) |
| *B32B 27/08* | (2006.01) |
| *B32B 27/20* | (2006.01) |
| *B32B 27/30* | (2006.01) |
| *B32B 3/02* | (2006.01) |
| *B32B 3/08* | (2006.01) |

(52) U.S. Cl.
CPC .... *B32B 17/10018* (2013.01); *B32B 17/10623* (2013.01); *B32B 17/10788* (2013.01); *B32B 27/08* (2013.01); *B32B 27/20* (2013.01); *B32B 27/306* (2013.01); *B32B 27/32* (2013.01); *H01L 31/02008* (2013.01); *H01L 31/049* (2014.12); *H01L 31/0481* (2013.01); *H01L 31/056* (2014.12); *B32B 2264/102* (2013.01); *B32B 2264/104* (2013.01); *B32B 2307/202* (2013.01); *B32B 2307/412* (2013.01); *B32B 2323/00* (2013.01); *B32B 2457/12* (2013.01); *Y02E 10/50* (2013.01)

(56) References Cited

U.S. PATENT DOCUMENTS

| | | | |
|---|---|---|---|
| 2007/0227584 A1* | 10/2007 | Tsunomura et al. | 136/251 |
| 2008/0041434 A1* | 2/2008 | Adriani | B23K 31/02 |
| | | | 136/244 |
| 2010/0275980 A1 | 11/2010 | Karpinski et al. | |
| 2011/0183442 A1 | 7/2011 | Oi et al. | |
| 2012/0048335 A1* | 3/2012 | Nakamura | 136/244 |

FOREIGN PATENT DOCUMENTS

| | | |
|---|---|---|
| JP | 2001-267596 A | 9/2001 |
| JP | 2005-079170 A | 3/2005 |
| JP | 2006-036874 A | 2/2006 |
| JP | 2010-104929 A | 5/2010 |
| JP | WO2010122935 * | 10/2010 |

\* cited by examiner

SOLAR CELL MODULE

CROSS REFERENCE TO RELATED APPLICATIONS

This application is a continuation application of International Application No. PCT/JP2012/078834, filed on Nov. 7, 2012, entitled "SOLAR CELL MODULE", which claims priority based on Article 8 of Patent Cooperation Treaty from prior Japanese Patent Applications No. 2011-246067, filed on Nov. 10, 2011, No. 2011-281438, filed on Dec. 22, 2011, and No. 2011-281565, filed on Dec. 22, 2011, the entire contents of which are incorporated herein by reference.

TECHNICAL FIELD

The invention relates to a solar cell module.

BACKGROUND ART

In recent years, solar cell modules have attracted attention as an environmentally-friendly energy source.

For example, Patent Document 1 discloses a solar cell module obtained by laminating a first main surface side sealing material, a solar cell element group including solar cell elements arrayed therein, a white-colored or colored second main surface side sealing material and a second main surface protection material in this order on a transparent substrate. In this solar cell module, the first main surface side sealing material is made of a transparent material. The first and second main surface side sealing materials are each made of ethylene-vinyl acetate copolymer.

PRIOR ART DOCUMENT PATENT DOCUMENT 1: Japanese Patent Application Publication No. 2005-79170

SUMMARY OF THE INVENTION

In the solar cell module as described in Patent Document 1, solar cells and the first main surface side sealing material are likely to separate from each other.

One aspect of the invention is to provide a solar cell module in which a solar cell and a sealing material are less likely to separate from each other.

A solar cell module of an embodiment includes a solar cell, a wiring material and a sealing material. The solar cell has first and second main surfaces. The wiring material is electrically connected to the solar cell on the first main surface. The sealing material seals the solar cell. The sealing material has a first sealing section and a second sealing section. The first sealing section contains a non-crosslinking resin. The first sealing section is positioned on the first main surface side of the solar cell. The second sealing section contains a crosslinking resin and pigment. The second sealing section is positioned on the second main surface side of the solar cell.

According to the solar cell module described above, a solar cell and a sealing material are less likely to separate from each other.

EMBODIMENTS

Embodiments of the invention are described below. However, the following embodiments are merely illustrative. The invention is not limited to the following embodiments.

In addition, the drawings to be referred to in the embodiments are schematic, and ratios of dimensions of objects drawn in the drawings and the like may be different from those of actual ones. Therefore, specific ratios of dimensions of the objects and the like should be determined in consideration of the following description.

(First Embodiment)

Figure 1:
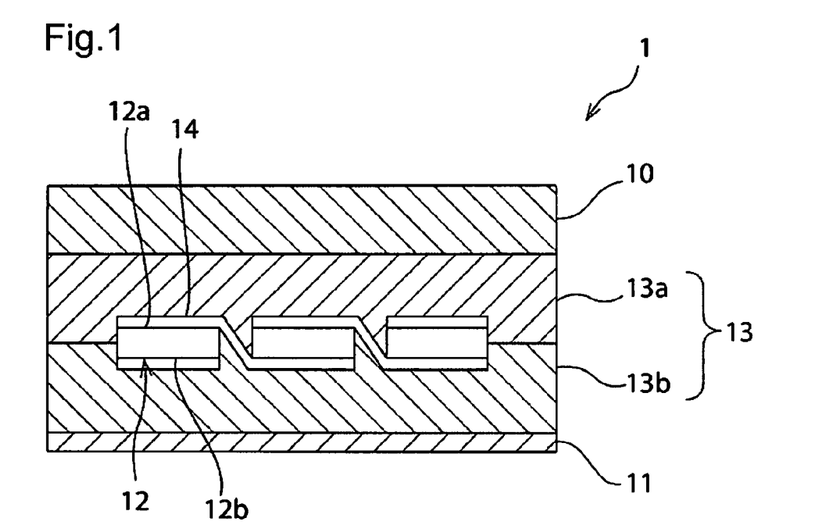
FIG. 1 is a schematic cross-sectional view of a solar cell module according to a first embodiment.

As illustrated in FIG. 1, solar cell module 1 includes solar cells 12. Each of solar cells 12 has first main surface 12a and second main surface 12b. The type of solar cells 12 is not particularly limited. Solar cells 12 may be crystalline silicon solar cells, polycrystalline silicon solar cell and the like, for example. Solar cell 12 may generate power only when receiving light on first main surface 12a. Alternatively, solar cell 12 may generate power not only when receiving light on first main surface 12a but also when receiving light on second main surface 12b.

Solar cell 12 includes a first electrode provided on the first main surface 12a side and a second electrode provided on the second main surface 12b side. One of the first and second electrodes collects electrons and the other one collects holes.

Solar cells 12 are electrically connected to each other by wiring materials 14. More specifically, the first electrode in one of adjacent solar cells 12 is electrically connected to the second electrode in the other one by wiring material 14. Thus, a one-side portion of wiring material 14 is electrically connected to solar cell 12 on first main surface 12a.

Note that wiring material 14 and solar cell 12 are bonded with resin adhesive or solder. It is preferable that wiring material 14 and solar cell 12 are bonded with resin adhesive. The resin adhesive may contain a conducting material.

Sealing material 13 seals solar cells 12. Sealing material 13 has first sealing section 13a and second sealing section 13b. First sealing section 13a is positioned on the first main surface 12a side of solar cell 12. Second sealing section 13b is positioned on the second main surface 12b side of solar cell 12.

First sealing section 13a contains a non-crosslinking resin. The non-crosslinking resin is preferably a resin containing no vinyl acetate monomer unit, and is more preferably a polyolefin resin containing no vinyl acetate monomer unit. The polyolefin resin containing no vinyl acetate monomer unit preferably contains at least one of polyethylene resin and polypropylene resin.

Note that, in the embodiment, the non-crosslinking resin means a resin having a gel fraction of 50% or less. In the embodiment, the "gel fraction" is measured by the following measurement method. First, 1 g of a resin to be measured is prepared. Then, the resin is immersed in 100 ml of xylene for 24 hours at 120° C. Thereafter, residues in xylene are extracted and then dried at 80° C. for 16 hours. Subsequently, the mass of the dried residues is measured. From the result thus obtained, the gel fraction (%) is calculated based on the following equation (1).

$$(\text{gel fraction}(\%))=(\text{mass of residues}(g))/(\text{mass of resin before immersion}(g)) \quad (1)$$

Second sealing section 13b contains a crosslinking resin. The crosslinking resin is preferably an ethylene-vinyl acetate copolymer (EVA). In the embodiment, the crosslinking resin is a resin having a gel fraction of more than 50%.

Second sealing section 13b contains pigment. The color of pigment is not particularly limited, and may be white, for example. Specific examples of the white pigment include titanium dioxide, zinc oxide, white lead, barium sulfate, barium borate, calcium carbonate, magnesium oxide, and the like, for example.

Sealing material 13 is disposed between first protection member 10 and second protection member 11. First protection member 10 is located to the first main surface 12a side of solar cell 12. First protection member 10 can be made of a glass plate or the like, for example. Second protection member 11 is located to the second main surface 12b side of solar cell 12. Second protection member 11 faces first protection member 10. Second protection member 11 can be made of a resin, for example. Second protection member 11 may have a metal layer made of aluminum or the like or an inorganic layer made of silica or the like.

In a solar cell module described in Patent Document 1, first and second main surface side sealing materials are made of ethylene-vinyl acetate copolymer, and the first main surface side sealing material (the sealing material on the light receiving surface side) is made transparent and the second main surface side sealing material (the sealing material on the rear surface side) is colored in white. In such a solar cell module, solar cells and the first main surface side sealing material are likely to separate from each other.

On the other hand, in solar cell module 1, first sealing section 13a positioned on the first main surface 12a side of solar cell 12 contains the non-crosslinking resin. This prevents solar cells 12 and first sealing section 13a from separating from each other. The possible reason for this is as follows. The addition of pigment to the second sealing section causes a difference in property between the first sealing section containing no pigment and the second sealing section containing pigment. Normally, the second sealing section containing pigment becomes more rigid than the first sealing section containing no pigment. Therefore, stress caused by the difference in rigidity between the first and second sealing sections makes the solar cells and first sealing section 13a likely to separate from each other on the first sealing section side of the solar cells. Here, in solar cell module 1, first sealing section 13a contains the non-crosslinking resin. This increases the adhesion strength of first sealing section 13a not only at normal temperature but also at a high temperature of 75° C. or higher. This increased adhesion strength is considered to suppress separation between solar cells 12 and wiring materials 14 on the first sealing section 13a side.

The non-crosslinking resin contained in first sealing section 13a is softened at a high temperature of 75° C. or higher, thereby relieving the stress and increasing the adhesion to solar cells 12. Thus, solar cells 12 and first sealing section 13a are less likely to separate from each other.

When the crosslinking resin contained in second sealing section 13b is the ethylene-vinyl acetate copolymer, the rigidity of the resin is high even at a high temperature of 75° C. or higher after crosslinking. However, the stress is relieved by lowering the rigidity of first sealing section 13a. Thus, solar cells 12 and first sealing section 13a are less likely to separate from each other.

The invention is described in more detail below based on specific examples. The invention is not limited to the following examples but can be carried out by making appropriate changes without departing from the scope of the invention.

(Embodiment Example)

In Embodiment Example 1, a solar cell module having substantially the same configuration as that of solar cell module 1 according to the above embodiment is prepared by using a transparent non-crosslinking resin to form first sealing section 13a and using a crosslinking resin containing white pigment to form second sealing section 13b. To be more specific, a polyolefin resin containing no vinyl acetate monomer unit is used as a material to form first sealing section 13a. Also, an ethylene-vinyl acetate copolymer (EVA) containing titanium dioxide is used as a material to form second sealing section 13b.

COMPARATIVE EXAMPLE 1

In Comparative Example 1, a solar cell module having substantially the same configuration as that of Embodiment Example 1 is prepared, except that a transparent crosslinking resin is used to form first sealing section 13a and a white crosslinking resin is used to form second sealing section 13b. To be more specific, an ethylene-vinyl acetate copolymer (EVA) containing no white pigment is used as a material to form first sealing section 13a. Also, an ethylene-vinyl acetate copolymer (EVA) containing titanium dioxide is used as a material to form second sealing section 13b.

COMPARATIVE EXAMPLE 2

In Comparative Example 2, a solar cell module having substantially the same configuration as that of Comparative Example 1 is prepared, except that a crosslinking resin containing no white pigment is used to form second sealing section 13b. To be more specific, an ethylene-vinyl acetate copolymer (EVA) containing no white pigment is used as a material to form first sealing section 13a. Also, an ethylene-vinyl acetate copolymer (EVA) containing no white pigment is used as a material to form second sealing section 13b.

For the respective solar cell modules of Embodiment Example 1 and Comparative Examples 1 and 2 thus prepared, moisture resistance tests are conducted. More specifically, the solar cell modules are kept in an atmosphere with a humidity of 85% and a temperature of 85° C. for a predetermined period of time of 1000 hours or more. Thereafter, it is visually observed whether or not first sealing section 13a is peeled off. Table 1 shows the results.

As shown in Table 1, peel-off of first sealing section 13a is observed after the moisture resistance test in Comparative Example 1, while no peel-off of first sealing section 13a is observed even after the moisture resistance test in Embodiment Example 1. In the solar cell module of Comparative Example 2 using no white pigment, the crosslinking resin is used for both of first and second sealing sections 13a and 13b as in the case of Comparative Example 1. However, no peel-off of first sealing section 13a is observed even after the moisture resistance test. The peel-off of first sealing section 13a observed in Comparative Example 1 is considered to occur due to a change in rigidity of second sealing section 13b, which is caused by the addition of the white pigment to the crosslinking resin. Even when the white crosslinking resin is used for second sealing section 13b as in Embodiment Example 1, the use of the transparent non-crosslinking resin for first sealing section 13a can prevent separation between solar cells 12 and first sealing section 13a.

TABLE 1

|  | Embodiment Example 1 | Comparative Example 1 | Comparative Example 2 |
| --- | --- | --- | --- |
| First sealing section 13a (light-receiving surface side) | non-crosslinking resin (transparent) | crosslinking resin (transparent) | crosslinking resin (transparent) |
| Second sealing section 13b (rear surface side) | crosslinking resin (white) | crosslinking resin (white) | crosslinking resin (transparent) |
| moisture resistance test | no peel-off observed | peel-off observed | no peel-off observed |

(Second Embodiment)

Figure 2:
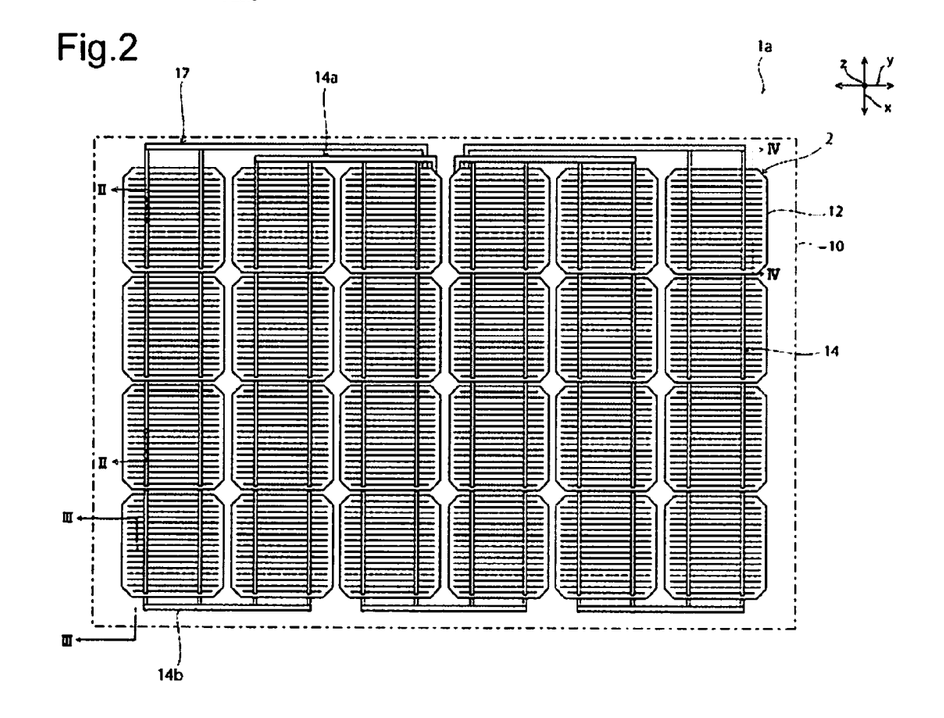
FIG. 2 is a schematic plan view of a solar cell module according to a second embodiment.
Figure 3:
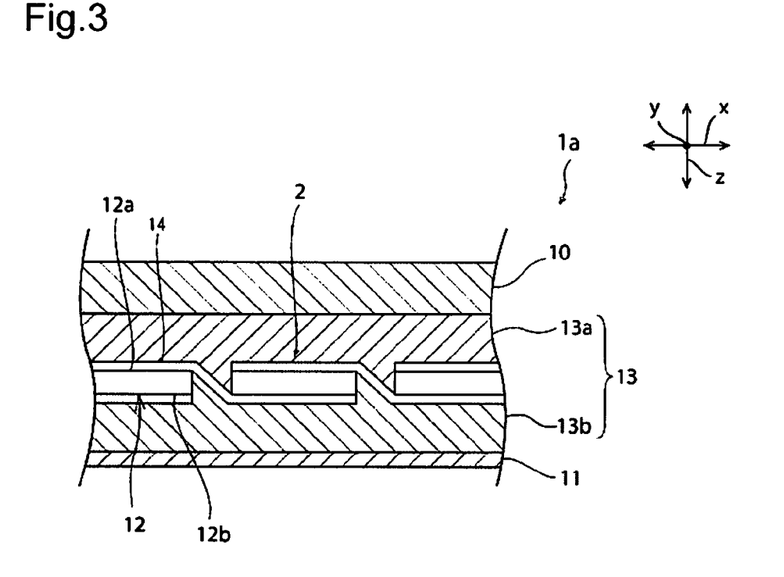
FIG. 3 is a schematic cross-sectional view taken along the line II-II in FIG. 2.
Figure 4:
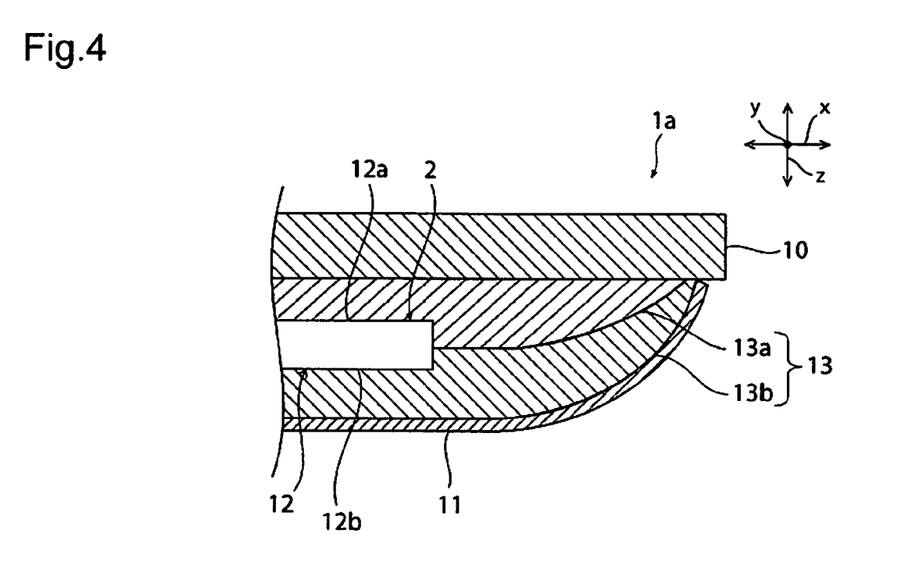
FIG. 4 is a schematic cross-sectional view taken along the line in FIG. 2.

As illustrated in FIGS. 2 to 4, solar cell module 1a includes solar cell strings 2. Solar cell strings 2 are arranged at intervals therebetween along a y-axis direction. Solar cell strings 2 are electrically connected to each other by wiring materials 14a and 14b. Lead wirings 17 drawn out to the outside of solar cell module 1a are electrically connected to solar cell strings 2.

Each of solar cell strings 2 includes solar cells 12. In each solar cell string 2, solar cells 12 are arranged at intervals therebetween along an x-axis direction perpendicular to the y-axis direction. In each solar cell string 2, solar cells 12 are electrically connected to each other by wiring materials 14.

Note that, in this embodiment, description is given of an example where the solar cell module includes solar cells. However, the invention is not limited to such a configuration. The solar cell module according to the invention may include only one solar cell.

Each of solar cells 12 has light-receiving surface 12a and rear surface 12b. Here, the "light-receiving surface" primarily means a main surface that receives light. Solar cell 12 may generate power only when receiving light on light-receiving surface 12a. Alternatively, solar cell 12 may generate power not only when receiving light on light-receiving surface 12a but also when receiving light on rear surface 12b.

First protection member 10 is located to the light-receiving surface 12a side of solar cell 12. First protection member 10 can be made of glass or the like, for example.

Second protection member 11 is located to the rear surface 12b side of solar cell 12. Second protection member 11 can be made of resin, for example. In second protection member 11, a metal layer made of aluminum or the like or an inorganic layer made of silica or the like, for example, may be formed using a resin sheet provided therein.

Sealing material section (sealing section) 13 is provided between first and second protection members 10 and 11. This sealing material section 13 seals solar cell strings 2. Therefore, sealing material section 13 forms the sealing section.

Sealing material section 13 includes first sealing material section 13a serving as a first sealing section and second sealing material section 13b serving as a second sealing section. First sealing material section 13a is disposed between solar cells 12 and first protection member 10. Meanwhile, second sealing material section 13b is disposed between solar cells 12 and second protection member 11.

Second sealing material section 13b contains pigment. This pigment is to improve optical reflectivity of second sealing material section 13b. Pigment can be made of a white pigment such as titanium oxide, for example. Note, however, that pigment may have a color other than white as long as pigment can improve the optical reflectivity of second sealing material section 13b. In other words, pigment is not particularly limited as long as pigment reflects light in at least a part of a wavelength range that contributes to power generation by solar cells 12. Meanwhile, first sealing material section 13a located to the light-receiving surface 12a side of solar cell 12 preferably contains no pigment. This is to increase the light receiving efficiency of solar cells 12.

Each of first and second sealing material sections 13a and 13b may contain resin, for example. More specifically, each of first and second sealing material sections 13a and 13b may contain a non-crosslinking resin made of polyethylene, polypropylene or the like, or a crosslinking resin made of an ethylene-vinyl acetate copolymer (EVA), polyethylene, polypropylene or the like, for example. Second sealing material section 13b preferably contains the crosslinking resin, and more preferably contains the ethylene-vinyl acetate copolymer. First sealing material section 13a preferably contains at least one of polyethylene and polypropylene or the ethylene-vinyl acetate copolymer.

Note that, in the embodiment, the "crosslinking resin" means a resin having a gel fraction of 50% or more. On the other hand, the "non-crosslinking resin" means a resin having a gel fraction of less than 50%.

In the embodiment, the "gel fraction" is measured by the following measurement method. First, 1 g of a resin to be measured is prepared. Then, the resin is immersed in 100 ml of xylene for 24 hours at 120° C. Thereafter, residues in xylene are extracted and then dried at 80° C. for 16 hours. Subsequently, the mass of the dried residues is measured. From the result thus obtained, the gel fraction (%) is calculated based on the following equation (1).

$$\text{(gel fraction(\%))} = \text{(mass of residues}(g))/\text{(mass of resin before immersion}(g)) \quad (1)$$

As illustrated in FIG. 4, second sealing material section 13b containing pigment has a gel fraction larger than that of first sealing material section 13a which contains no pigment and is positioned on the light-receiving surface 12a side of solar cell 12. Second sealing material section 13b is provided so as to cover a surface and a side surface of first sealing material section 13a. An end of second sealing material section 13b comes into contact with first protection member 10. Therefore, second sealing material section 13b containing pigment is provided on the entire rear surface 12b side and lateral side of solar cell 12.

Next, description is given of an example of a method of manufacturing solar cell module 1a.

First, at least one resin sheet to form first sealing material section 13a is located to first protection member 10. Then, solar cell strings 2, at least one resin sheet to form second sealing material section 13b, and second protection member 11 are disposed thereon in this order. Here, the resin sheet used to form second sealing material section 13b is larger than that used to form first sealing material section 13a. The resin sheet to form second sealing material section 13b is disposed such that an end of the resin sheet to form second sealing material section 13b is exposed from the resin sheet to form first sealing material section 13a.

Solar cell module 1a can be completed by laminating the laminated bodies thus obtained.

As described above, in solar cell module 1a, second sealing material section 13b located to the rear surface 12b side of solar cell 12 contains pigment. For this reason, light made incident on a region of solar cell module 1a where no solar cells 12 are provided is diffuse-reflected by second sealing material section 13b. As a result, use efficiency of the light made incident on solar cell module 1a is increased. Therefore, improved output characteristics can be obtained.

Also, in solar cell module 1a, second sealing material section 13b containing pigment is provided so as to cover the surface and the side surface of first sealing material section 13a. Thus, light leakage from the side surface of solar cell module 1a can be suppressed. As a result, the use efficiency of the light made incident on solar cell module 1a can be further increased. Therefore, further improved output characteristics can be obtained.

In terms of obtaining the further improved output characteristics, the end of second sealing material section 13b preferably comes into contact with first protection member 10. Also, second protection member 11 preferably covers the surface and the side surface of second sealing material section 13b.

Second sealing material section 13b preferably contains the crosslinking resin such as an ethylene-vinyl acetate copolymer. The crosslinking resin has a low fluidity even under high temperature. Therefore, by allowing second sealing material section 13b to contain the crosslinking resin, a low fluidity of second sealing material section 13b is realized even when solar cell module 1a reaches a high temperature. Thus, displacement of solar cells 12 and the like can be suppressed.

In terms of more effectively suppressing the displacement of solar cells 12 and the like when solar cell module 1a reaches a high temperature, the end of second sealing material section 13b containing the crosslinking resin preferably comes into contact with first protection member 10. This configuration is particularly effective when first sealing material section 13a contains the non-crosslinking resin such as polyethylene or polypropylene.

Note that the non-crosslinking resin such as polyethylene or polypropylene has better adhesion properties than the crosslinking resin such as the ethylene-vinyl acetate copolymer under normal temperature. Therefore, in terms of suppressing the displacement of solar cells 12 under both normal temperature and high temperature, it is preferable that first sealing material section 13a contains the non-crosslinking resin and second sealing material section 13b contains the crosslinking resin.

Figure 5:
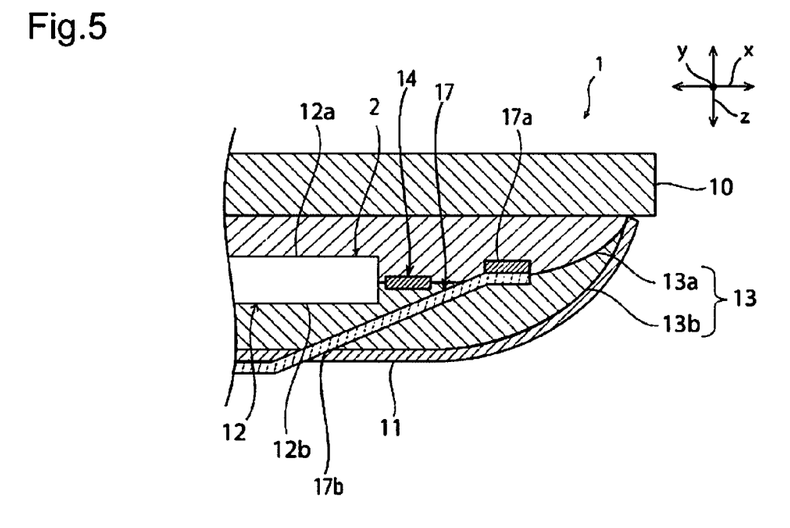
FIG. 5 is a schematic cross-sectional view taken along the line IV-IV in FIG. 2.

Next, mainly with reference to FIG. 5, detailed description is given of a configuration of lead wiring 17 in solar cell module 1a according to this embodiment. Outer end portion 17a of lead wiring 17 is positioned on the outer side than solar cell 12. Lead wiring 17 is extended toward the center of solar cell module 1a from outer end portion 17a. Lead wiring 17 penetrates second protection member 11 through the inside of sealing material section 13 and reaches the surface of second protection member 11, which is on the opposite side to sealing material section 13.

At least a part of a portion of lead wiring 17 positioned inside sealing material section 13 overlaps with solar cell 12 in a thickness direction. Overlapping portion 17b of lead wiring 17, which is a part of the portion of lead wiring 17 positioned inside sealing material section 13, overlaps with solar cell 12 in the thickness direction. Second sealing material section 13b which is made of a crosslinking resin and has a low fluidity under high temperature is positioned both between overlapping portion 17b of lead wiring 17 and solar cell 12 and between overlapping portion 17b and second protection member 11. In other words, overlapping portion 17b is held by second sealing material section 13b having a low fluidity under high temperature. Thus, displacement of lead wiring 17 when solar cell module 1a reaches a high temperature can be suppressed.

As described above, in manufacturing of solar cell module 1a having second sealing material section 13b positioned on both sides of overlapping portion 17b, another resin sheet may be provided between overlapping portion 17b and solar cell 12.

(Third Embodiment)

Figure 6:
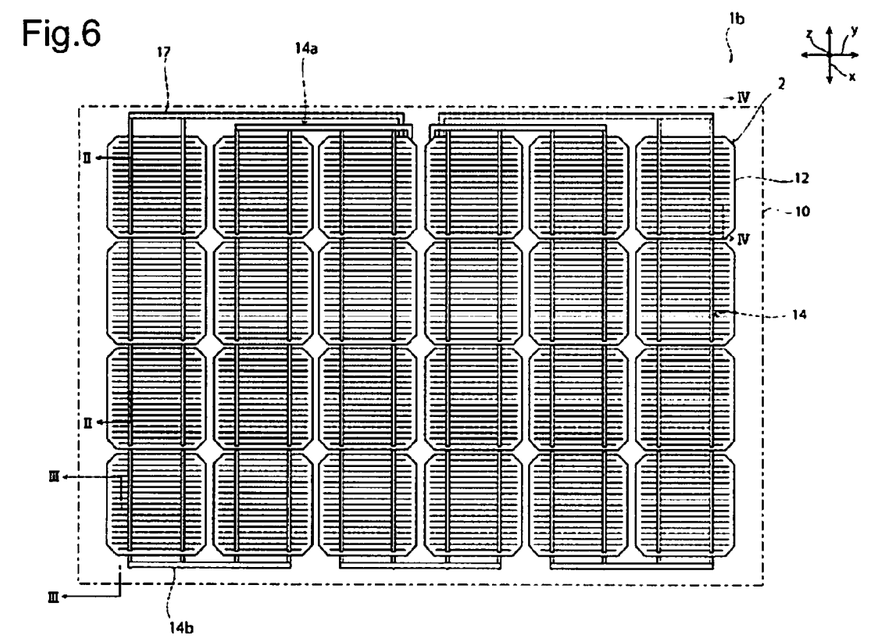
FIG. 6 is a schematic plan view of a solar cell module according to a third embodiment.
Figure 7:
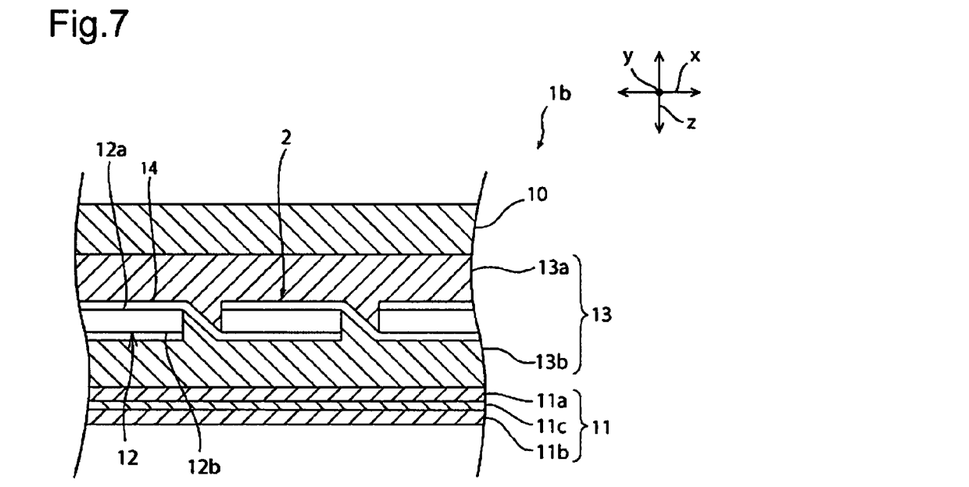
FIG. 7 is a schematic cross-sectional view taken along the line II-II in FIG. 6.
Figure 8:
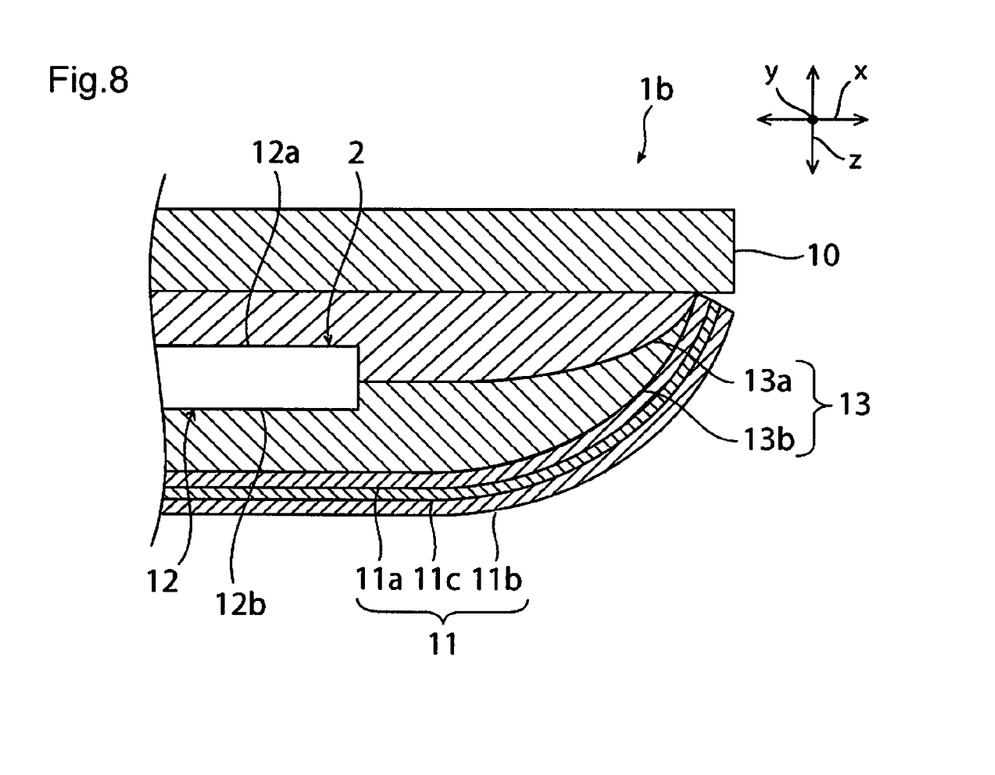
FIG. 8 is a schematic cross-sectional view taken along the line in FIG. 6.

As illustrated in FIGS. 6 to 8, solar cell module 1b includes solar cell strings 2. Solar cell strings 2 are arranged at intervals therebetween along a y-axis direction. Solar cell strings 2 are electrically connected to each other by wiring materials 14a and 14b. Lead wirings 17 drawn out to the outside of solar cell module 1b are electrically connected to solar cell strings 2.

Each of solar cell strings 2 includes solar cells 12. In each solar cell string 2, solar cells 12 are arranged at intervals therebetween along an x-axis direction perpendicular to the y-axis direction. In each solar cell string 2, solar cells 12 are electrically connected to each other by wiring materials 14.

Note that, in this embodiment, description is given of an example where the solar cell module includes solar cells. However, the invention is not limited to such a configuration. The solar cell module according to the invention may include only one solar cell.

First protection member 10 is located to one main surface 12a side of solar cell 12. First protection member 10 is made of glass. In this embodiment, first protection member 10 is made of glass containing alkali metal components such as sodium.

Second protection member 11 is located to the other main surface 12b side of solar cell 12. At least a surface layer of second protection member 11 on the first protection member 10 side contains at least one of polyethylene and polypropylene. In this embodiment, second protection member 11 includes first portion 11a forming the surface layer on the first protection member 10 side, second portion 11b forming a surface layer on the opposite side to first protection member 10, and third portion 11c provided between first and second portions 11a and 11b. First and third portions 11a and 11c contain at least one of polyethylene and polypropylene. Second portion 11b includes an inorganic layer made of aluminum foil, silica or the like, for example, and the like.

In solar cell module 1b, one main surface 12a of solar cell 12 serves as a light-receiving surface and the other main surface 12b serves as a rear surface. Here, the "light-receiving surface" primarily means a main surface that receives light. Solar cell may generate power only when receiving light on the light-receiving surface. Alternatively, solar cell 12 may generate power not only when receiving light on the light-receiving surface but also when receiving light on the rear surface.

Sealing material section 13 is provided between first and second protection members 10 and 11. This sealing material section 13 seals solar cell strings 2. Therefore, sealing material section 13 forms a sealing section.

Sealing material section 13 includes first sealing material section 13a serving as a first sealing section and second sealing material section 13b serving as a second sealing section. First sealing material section 13a is disposed between solar cells 12 and first protection member 10. First sealing material section 13a contains at least one of polyethylene and polypropylene. First sealing material section 13a and the surface layer of second protection member 11 on the first protection member 10 side may be made of the same material or different materials.

Second sealing material section 13b is disposed between solar cells 12 and second protection member 11. Second sealing material section 13b contains a crosslinking resin made of an ethylene-vinyl acetate copolymer (EVA), polyethylene, polypropylene or the like.

Note that second sealing material section 13b positioned on the rear surface side may contain pigment such as titanium oxide, for example.

As illustrated in FIG. 8, first sealing material section 13a positioned on the first protection member 10 side is larger than second sealing material section 13b positioned on the second protection member 11 side. An end of first sealing material section 13a reaches outside of an end of second sealing material section 13b. The end of first sealing material section 13a comes into contact with an end of second protection member 11.

Next, description is given of an example of a method of manufacturing solar cell module 1b.

First, at least one resin sheet to form first sealing material section 13a is located to first protection member 10. Then, solar cell strings 2, at least one resin sheet to form second sealing material section 13b, and second protection member 11 are disposed thereon in this order. Here, the resin sheet used to form first sealing material section 13a is larger than that used to form second sealing material section 13b. The resin sheet to form second sealing material section 13b is disposed such that an end of the resin sheet to form first sealing material section 13a is exposed from the resin sheet to form second sealing material section 13b. Then, second protection member 11 larger than second sealing material section 13b is disposed.

Solar cell module 1b can be completed by laminating the laminated bodies thus obtained.

As described above, in solar cell module 1b, first sealing material section 13a positioned between solar cells 12 and first protection member 10 made of glass contains at least one of polyethylene and polypropylene. Here, polyethylene and polypropylene have low moisture content. Thus, by allowing first sealing material section 13a to contain at least one of polyethylene and polypropylene, the moisture content of first sealing material section 13a can be lowered. Accordingly, alkali components such as Na contained in first protection member 10 are less likely to be eluted into sealing material section 13. Therefore, the alkali components such as Na contained in first protection member 10 can be effectively prevented from reaching solar cells 12. Thus, deterioration of solar cells 12 due to the alkali components can be suppressed. As a result, improved durability can be realized.

Moreover, in solar cell module 1b, at least the surface layer of second protection member 11 on the first protection member 10 side contains at least one of polyethylene and polypropylene having low moisture content. As a result, moisture is effectively prevented from permeating second protection member 11 and entering into sealing material section 13. Furthermore, second protection member 11 comes into contact with first sealing material section 13a containing at least one of polyethylene and polypropylene. Thus, moisture intrusion from the side surface of sealing material section 13 is also effectively suppressed. Accordingly, deterioration of solar cells 12 and wiring materials 14 and 14a due to moisture is suppressed.

Both of at least the surface layer of second protection member 11 on the first protection member 10 side and first sealing material section 13a contain at least one of polyethylene and polypropylene. Thus, a difference in dissolution parameter of the resin contained in at least the surface layer of second protection member 11 on the first protection member 10 side and first sealing material section 13a can be set to 1 or less. As a result, the adhesion between the end of second protection member 11 and the end of first sealing material section 13a is increased. Also, separation between second protection member 11 and first sealing material section 13a is effectively suppressed.

In terms of realizing further improved durability, it is conceivable to allow the entire sealing material section to contain at least one of polyethylene and polypropylene. When the entire sealing material section is made of a non-crosslinking resin such as polyethylene or polypropylene, fluidity of the entire sealing material section is increased when solar cell module reaches a high temperature. As a result, there is a possibility that solar cells 12 cannot be securely fixed.

In solar cell module 1b, on the other hand, second sealing material section 13b disposed between second protection member 11 and solar cells 12 contains the crosslinking resin. Thus, the fluidity of second sealing material section 13b is not increased much even when solar cell module 1b reaches a high temperature. Therefore, displacement of solar cells 12 when solar cell module 1b reaches a high temperature can be suppressed.

Note that, in the embodiment, the "crosslinking resin" means a resin having a gel fraction of 50% or more. On the other hand, the "non-crosslinking resin" means a resin having a gel fraction of less than 50%.

In the embodiment, the "gel fraction" is measured by the following measurement method. First, 1 g of a resin to be measured is prepared. Then, the resin is immersed in 100 ml of xylene for 24 hours at 120° C. Thereafter, residues in xylene are extracted and then dried at 80° C. for 16 hours. Subsequently, the mass of the dried residues is measured. From the result thus obtained, the gel fraction (%) is calculated based on the following equation (1).

$$\text{(gel fraction(\%))} = \text{(mass of residues}(g))/\text{(mass of resin before immersion}(g)) \quad (1)$$

Figure 9:
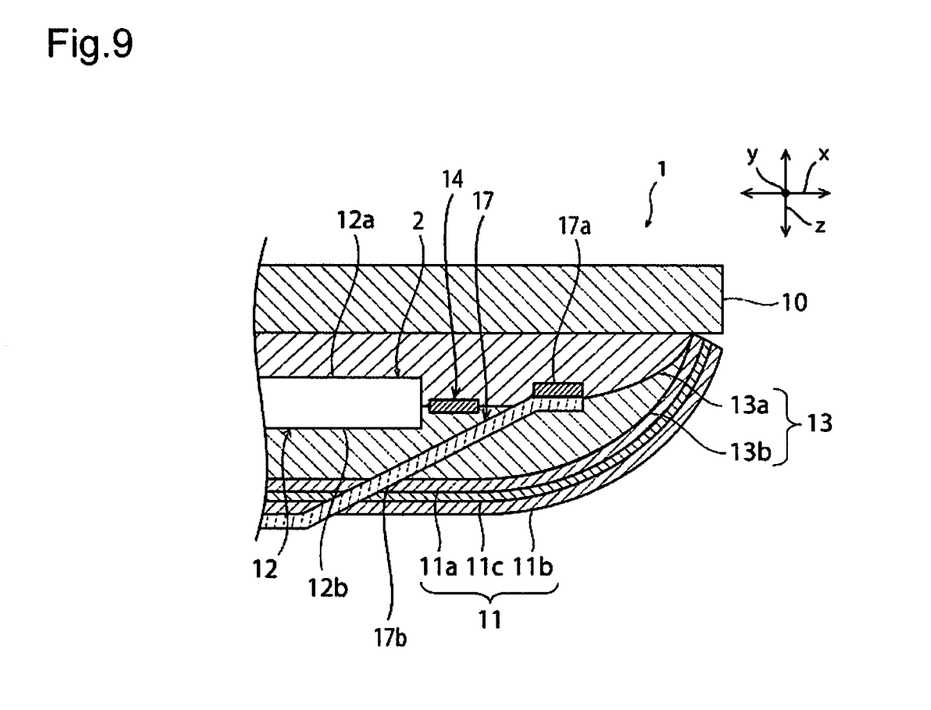
FIG. 9 is a schematic cross-sectional view taken along the line IV-IV in FIG. 6.

Next, mainly with reference to FIG. 9, detailed description is given of a configuration of lead wiring 17 in solar cell module 1b. Outer end portion 17a of lead wiring 17 is positioned on the outer side than solar cell 12. Lead wiring 17 is extended toward the center of solar cell module 1b from outer end portion 17a. Lead wiring 17 penetrates second protection member 11 through the inside of sealing material section 13 and reaches the surface of second protection member 11, which is on the opposite side to sealing material section 13.

At least a part of a portion of lead wiring 17 positioned inside sealing material section 13 overlaps with solar cell 12 in a thickness direction. Overlapping portion 17b of lead wiring 17, which is a part of the portion of lead wiring 17 positioned inside sealing material section 13, overlaps with solar cell 12 in the thickness direction. Second sealing material section 13b which is made of a crosslinking resin and has a low fluidity under high temperature is positioned both between overlapping portion 17b of lead wiring 17 and solar cell 12 and between overlapping portion 17b and second protection member 11. In other words, overlapping portion 17b is held by second sealing material section 13b having a low fluidity under high temperature. Thus, displacement of lead wiring 17 when solar cell module 1b reaches a high temperature can be suppressed.

As described above, in manufacturing of solar cell module 1b having second sealing material section 13b positioned on both sides of overlapping portion 17b, another resin sheet may be provided between overlapping portion 17b and solar cell 12.

The invention claimed is:

1. A solar cell module comprising:
   a solar cell with first and second main surfaces;
   a wiring material electrically connected to the solar cell on the first main surface;
   a first protection member that protects the first main surface side of the solar cell;
   a second protection member that protects the second main surface side of the solar cell;
   a sealing material sealing the solar cell between the first and second protection members;
   a lead wiring drawn from inside of the sealing member to outside of the solar cell module, the lead wiring penetrating through the second protection member,
   wherein the sealing material includes a first sealing section containing a non-crosslinking resin and positioned on the first main surface side of the solar cell, and a second sealing section containing a crosslinking resin and pigment and positioned on the second main surface side of the solar cell,
   the first sealing section is disposed between the solar cell and the first protection member,
   the second sealing section is disposed between the solar cell and the second protection member,
   the lead wiring includes an overlapping portion which is overlapped with the solar cell, between the solar cell and the second protection member, as viewed in a thickness direction of the solar cell,
   the second sealing section is provided on both sides of the overlapping portion of the leading wiring in the thickness direction of the solar cell,
   an end of the first sealing section reaches outside of an end of the second sealing section, and
   the end of the first sealing section is in contact with an end of the second protection member.

2. The solar cell module according to claim 1, wherein the non-crosslinking resin contains no vinyl acetate monomer unit.

3. The solar cell module according to claim 1, wherein the crosslinking resin is an ethylene-vinyl acetate copolymer.

4. The solar cell module according to claim 1, further comprising:
   wherein pigment improves optical reflectivity of the second sealing section, and
   the second sealing section is provided so as to cover a surface and a side surface of the first sealing section.

5. The solar cell module according to claim 4, wherein an end of the second sealing section is in contact with the first protection member.

6. The solar cell module according to claim 1,
   wherein the first sealing section contains at least one of polyethylene and polypropylene.

7. The solar cell module according to claim 6, wherein a surface layer on a first protection member side of the second protection member contains a resin whose difference in dissolution parameter from at least one of polyethylene and polypropylene contained in the first sealing section is not more than 1.

8. The solar cell module according to claim 6, wherein a surface layer on a first protection member side of the second protection member contains at least one of polyethylene and polypropylene.

9. The solar cell module according to claim 1, wherein the overlapping portion of the lead wiring is sandwiched in the second sealing section with respect to the thickness direction of the solar cell module.

* * * * *